(12) United States Patent
Chang

(10) Patent No.: US 8,087,736 B2
(45) Date of Patent: Jan. 3, 2012

(54) STOPPING STRUCTURE AND SERVER HAVING THE SAME

(75) Inventor: Lin-Wei Chang, Taipei (TW)

(73) Assignee: Inventec Corporation, Taipei (TW)

( * ) Notice: Subject to any disclaimer, the term of this patent is extended or adjusted under 35 U.S.C. 154(b) by 335 days.

(21) Appl. No.: 12/472,652

(22) Filed: May 27, 2009

(65) Prior Publication Data

US 2010/0264792 A1 Oct. 21, 2010

(30) Foreign Application Priority Data

Apr. 16, 2009 (TW) .............................. 98112683 A

(51) Int. Cl.
*A47F 7/00* (2006.01)

(52) U.S. Cl. .................................................. 312/223.1

(58) Field of Classification Search .................... 211/26; 312/223.1, 265.1–265.4, 319.1, 333, 334.4, 312/334.5; 384/21

See application file for complete search history.

(56) References Cited

U.S. PATENT DOCUMENTS

| 6,554,142 | B2 * | 4/2003 | Gray | 211/26 |
| 6,848,759 | B2 * | 2/2005 | Doornbos et al. | 312/319.1 |
| 7,093,725 | B2 * | 8/2006 | Hartman et al. | 211/26 |
| 7,382,623 | B2 * | 6/2008 | Hartman | 361/726 |
| 7,641,297 | B2 * | 1/2010 | Huang | 312/334.4 |
| 7,794,031 | B2 * | 9/2010 | Hsiung et al. | 312/334.46 |
| 2003/0189395 | A1 * | 10/2003 | Doornbos et al. | 312/334.1 |
| 2003/0234602 | A1 * | 12/2003 | Cutler et al. | 312/333 |

* cited by examiner

*Primary Examiner* — Jennifer E. Novosad

(74) *Attorney, Agent, or Firm* — J.C. Patents

(57) ABSTRACT

A stopping structure and a server having the same are provided. The server includes a rack, at least one chassis, and a stopping structure. The chassis disposed in the rack moves relative to the rack. The stopping structure is disposed between the rack and the chassis. The stopping structure includes an actuator, a guiding element, and a damper. The actuator is disposed on the chassis. The guiding element is disposed on the chassis, and the actuator moves parallelly between a first position and a second position along the guiding element relative to the chassis. The damper is disposed in the rack. When the chassis is moved out from the rack and the actuator is at the first position, the damper is interfered with the actuator. When the chassis is moved out from the rack and the actuator is at the second position, the damper is not interfered with the actuator.

8 Claims, 4 Drawing Sheets

STOPPING STRUCTURE AND SERVER HAVING THE SAME

CROSS-REFERENCE TO RELATED APPLICATION

This application claims the priority benefit of Taiwan application serial no. 98112683, filed on Apr. 16, 2009. The entirety of the above-mentioned patent application is hereby incorporated by reference herein and made a part of specification.

BACKGROUND OF THE INVENTION

1. Field of the Invention

The present invention generally relates to a stopping structure, in particular, to an impact-resistant stopping structure and a server having the same.

2. Description of Related Art

Currently, servers commonly used in the art are mostly rack mount computers that may be stacked or series-connected. For such a design, the size of a main board of a computer is greatly reduced; a central processing unit (CPU), a chipset, a memory, and a hard disk are respectively disposed in a chassis; and then the chassis is installed in the rack under the guidance of slide rails, so as to save the space and facilitate the removal and replacement. In fact, each server is an independent removable/replaceable computer, and has evolved into a rack mount computer that has a thinned-down structure, occupies little space, has low power consumption, and is easily managed.

A slide rail structure used on the rack is generally disposed on two sides of the chassis in pairs and capable of supporting the weight of the chassis and electronic elements therein, and pushes the chassis out from or into the rack by guiding the chassis to move horizontally. Further, the slide rail structure generally includes outer slide rails and inner slide rails, such that the chassis can slide relative to the rack through the combination of the outer slide rails and the inner slide rails.

In order to prevent the chassis from sliding out from the rack and falling off, a stopping structure may be disposed between the rack and the chassis. Generally, a protruding post is disposed on the slide rails, such that the chassis is interfered with the protruding post to be prevented from being moved out. Although this can prevent the chassis from sliding out from the rack, the violent shock of the chassis caused by the collision of the chassis with the protruding post when a user moves the chassis out from the rack fails to be taken into consideration. Especially when the user pulls out the chassis just for the purpose of checking electronic elements in the chassis, the server may not be powered off or shut down at this time, so that once subjected to the shock generated by the above motion, the operating electronic elements are easily damaged.

SUMMARY OF THE INVENTION

Accordingly, the present invention is directed to a stopping structure, which has an impact-resistant function.

The present invention is also directed to a server, which can protect electronic elements disposed therein from impacts.

According to an embodiment of the present invention, a stopping structure is applicable to a server. The server includes a rack and at least one chassis. The chassis disposed in the rack moves relative to the rack. The stopping structure is disposed between the rack and the chassis. The stopping structure includes an actuator, a guiding element, and a damper. The actuator is disposed on the chassis. The guiding element is disposed on the chassis, and the actuator moves parallelly between a first position and a second position along the guiding element relative to the chassis. The damper is disposed in the rack. When the chassis is moved out from the rack and the actuator is at the first position, the damper is interfered with the actuator. When the chassis is moved out from the rack and the actuator is at the second position, the damper is not interfered with the actuator.

According to an embodiment of the present invention, a server includes a rack, at least one chassis, and a stopping structure. The chassis disposed in the rack moves relative to the rack. The stopping structure is disposed between the rack and the chassis. The stopping structure includes an actuator, a guiding element, and a damper. The actuator is disposed on the chassis. The guiding element is disposed on the chassis, and the actuator moves parallelly between a first position and a second position along the guiding element relative to the chassis. The damper is disposed in the rack. When the chassis is moved out from the rack and the actuator is at the first position, the damper is interfered with the actuator. When the chassis is moved out from the rack and the actuator is at the second position, the damper is not interfered with the actuator.

In an embodiment of the present invention, the guiding element includes two guiding holes, the actuator includes two guiding posts that are respectively corresponding to the guiding holes, and the guiding posts are movably inserted into the guiding holes.

In an embodiment of the present invention, the stopping structure further includes an elastic element, each guiding post is provided with a steplike portion, and the elastic element is sleeved on one of the guiding posts. One end of the elastic element is closely pressed against the steplike portion, and the other end of the elastic element is closely pressed against the guiding element. When the actuator is at the second position, the actuator drives the steplike portion of the guiding post to compress the elastic element.

In an embodiment of the present invention, the actuator includes a body and a stopping portion. The body is disposed on the chassis and moves relative to the chassis through the guiding element, and a moving direction of the body is perpendicular to that of the chassis in the rack. The stopping portion is located on one side of the body and extends from the body and away from the chassis. When the actuator is at the first position, the damper is located on a movement path of the stopping portion. When the actuator is at the second position, the damper is not located on the movement path of the stopping portion.

In an embodiment of the present invention, the actuator further includes a driving portion on the other side of the body distant from the stopping portion.

As described above, the actuator and the damper are provided in the stopping structure and the server having the same of the present invention, so that when a user moves the chassis out from the rack, the damper not only can be interfered with the actuator so as to stop the chassis from being continuously moved out, but also can absorb an impulsive force generated by the actuator so as to protect electronic elements in the chassis from impacts caused by shock. Moreover, the actuator can move parallelly along the guiding element relative to the chassis, so that when pulling out the chassis, the user can firstly stop the chassis by utilizing the interaction between the damper and the actuator, subsequently move the actuator along the guiding element such that the actuator is no longer interfered with the damper, and then move the chassis out from the rack.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
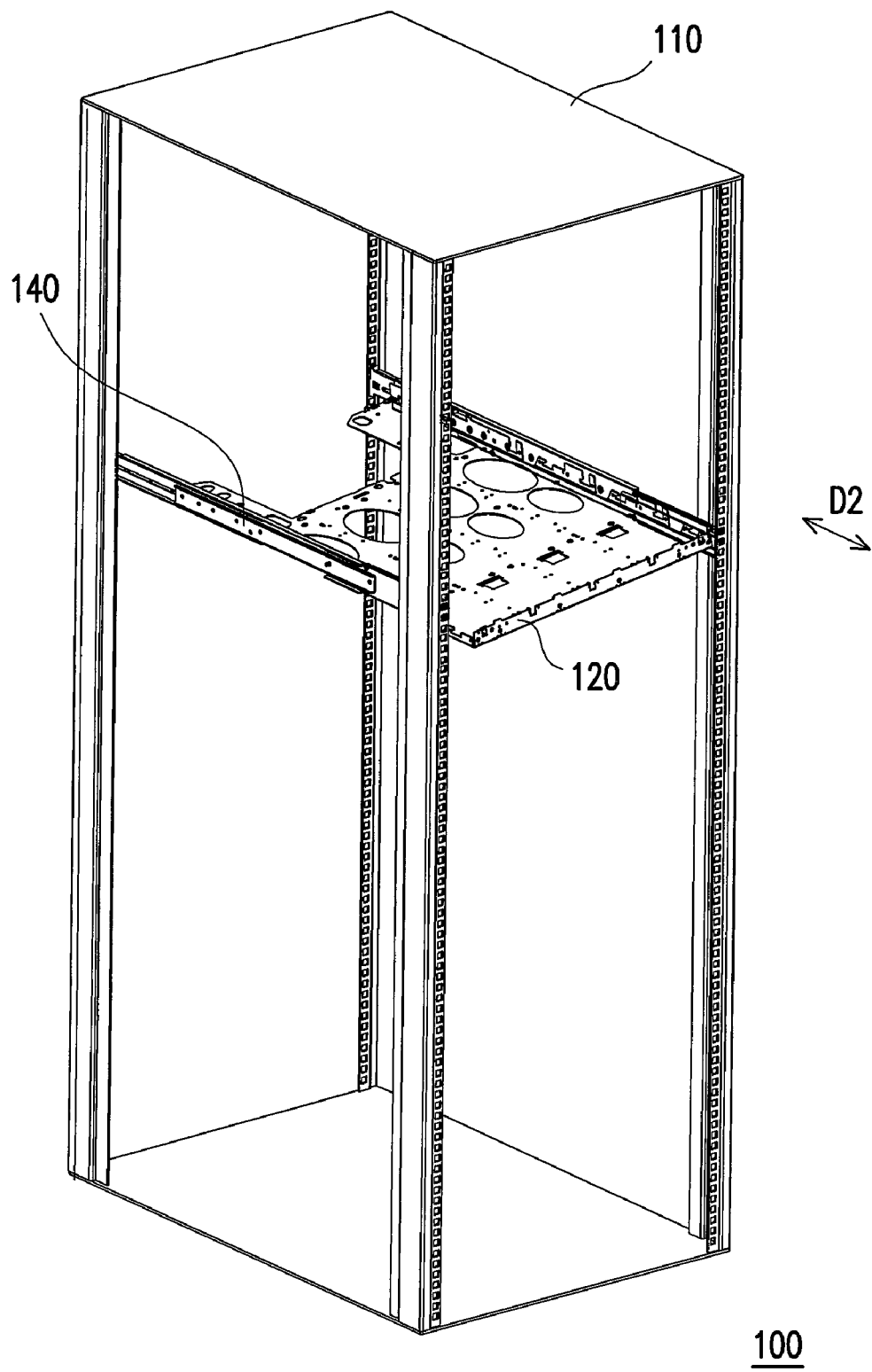
FIG. 1 is a schematic view of a server according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
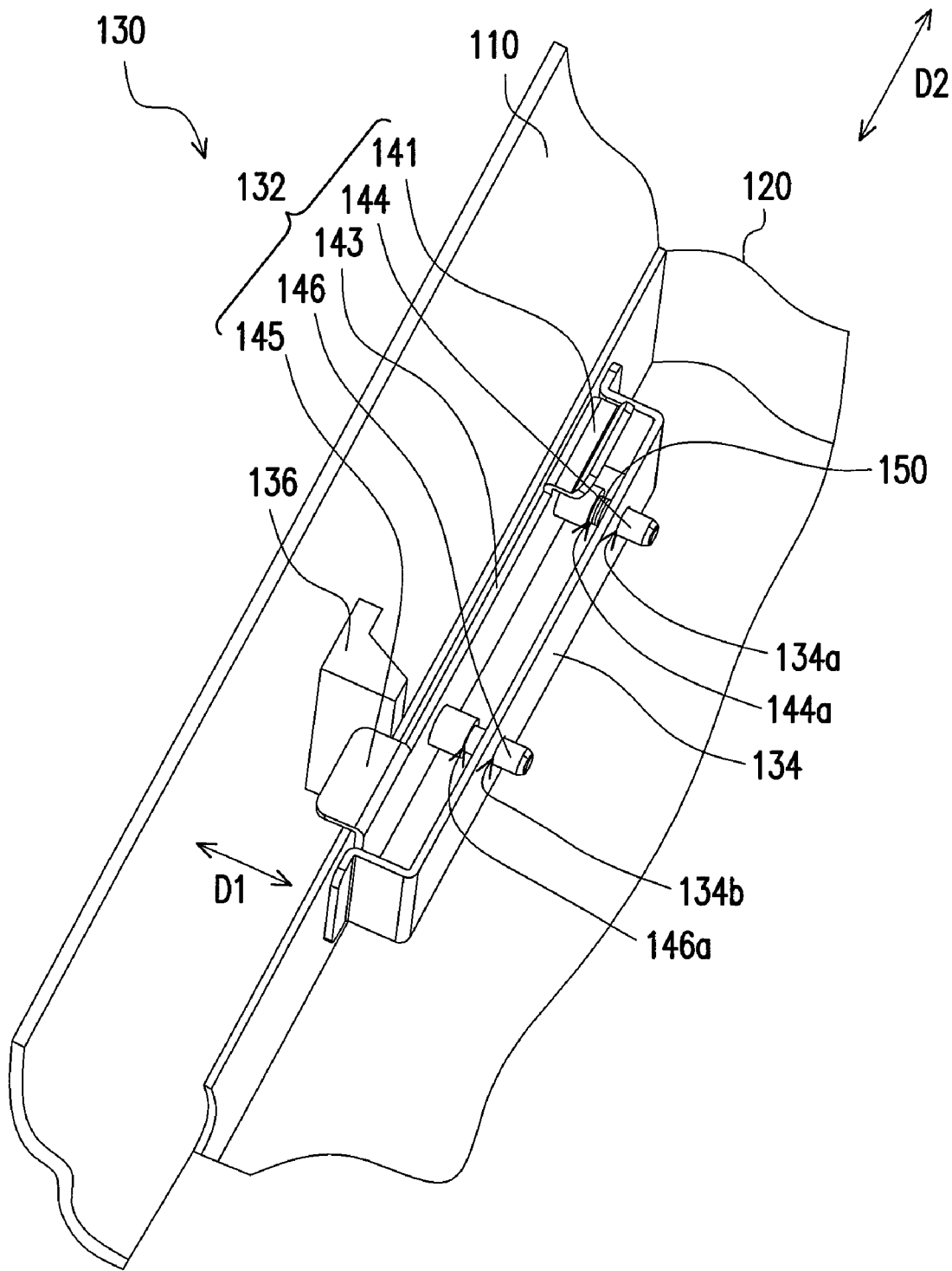
FIG. 2 is a partially enlarged view of a stopping structure of the server of FIG. 1.

FIG. 1 is a schematic view of a server according to an embodiment of the present invention. FIG. 2 is a partially enlarged view of a stopping structure of the server of FIG. 1. Referring to FIGS. 1 and 2, a server 100 includes a rack 110, a chassis 120, and a stopping structure 130. In this embodiment, only one chassis 120 disposed in a rack 130 is taken as an example for illustration. The chassis 120 disposed in the rack 130 moves along slide rails 140 in a movement direction D2 relative to the rack 110. The stopping structure 130 is disposed between the chassis 120 and the rack 110.

Figure 3:
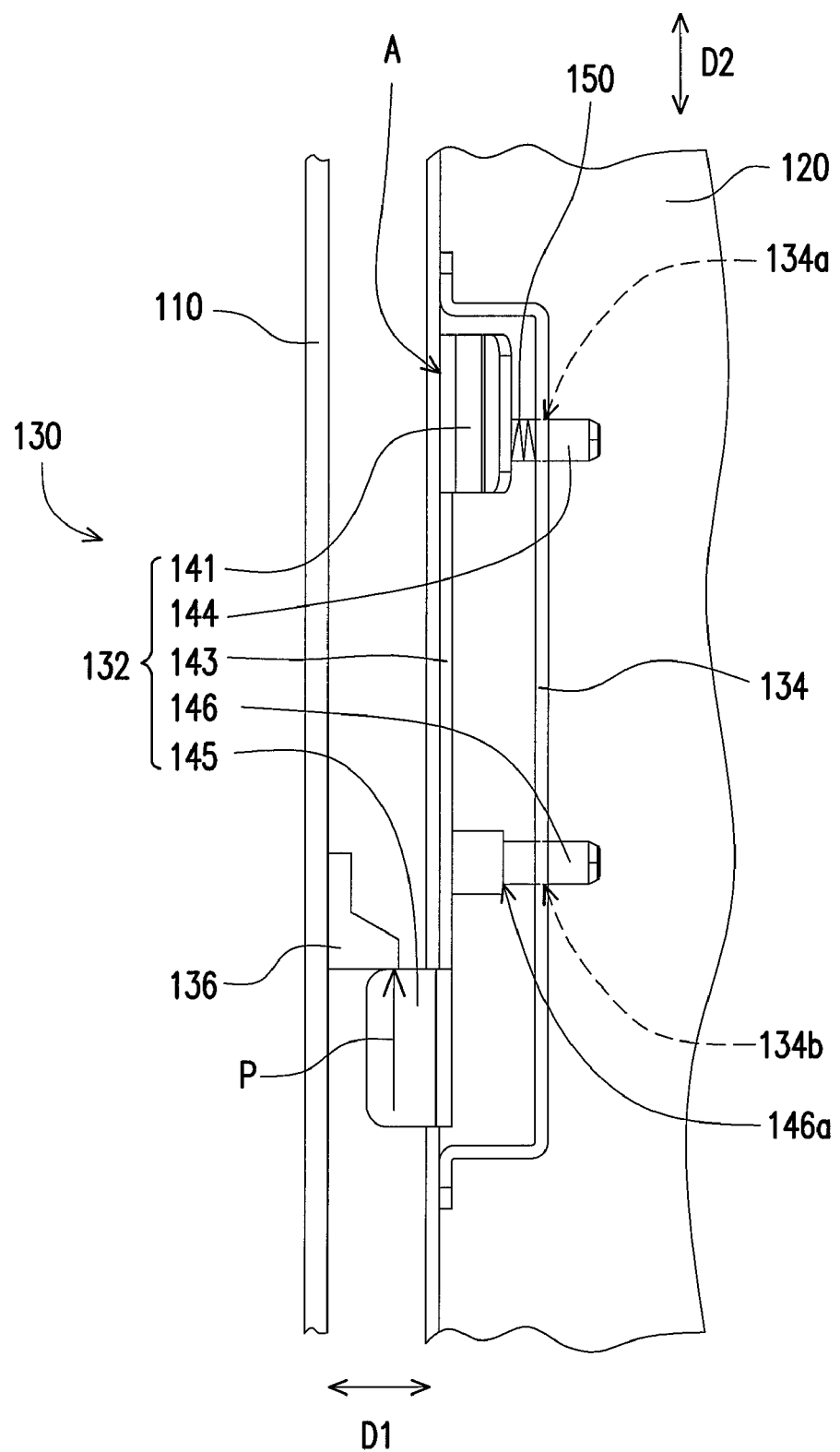
FIG. 3 is a partial top view of the server of FIG. 2 when an actuator therein is at a first position.
Figure 4:
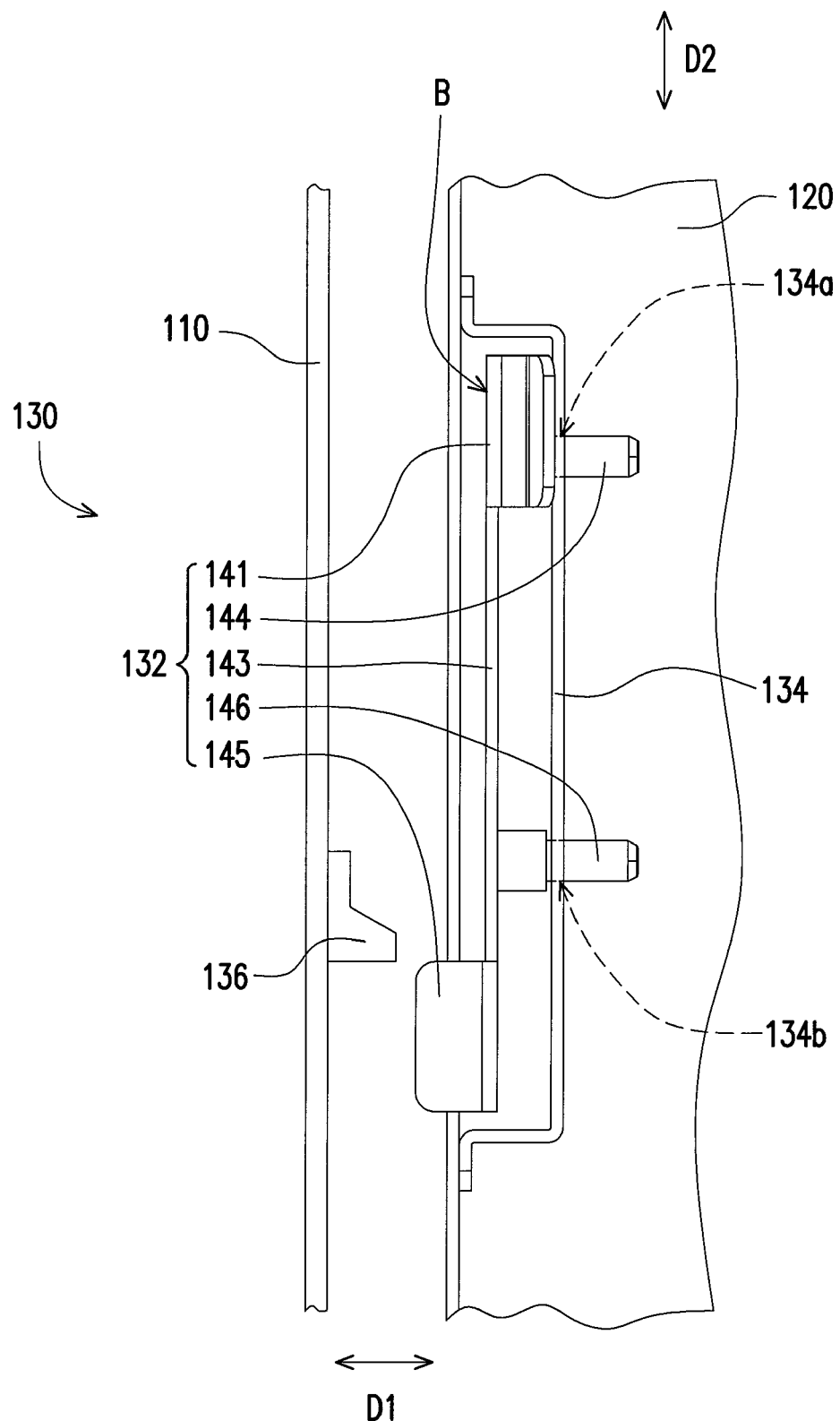
FIG. 4 is a partial top view of the server of FIG. 2 when the actuator therein is at a second position.

FIG. 3 is a partial top view of the server of FIG. 2 when an actuator therein is at a first position. FIG. 4 is a partial top view of the server of FIG. 2 when the actuator therein is at a second position. Referring to FIGS. 2, 3, and 4, the stopping structure 130 includes an actuator 132, a guiding element 134, and a damper 136. The actuator 132 is disposed on the chassis 120. The guiding element 134 is disposed on the chassis 120, and the actuator 132 moves parallelly between a first position A and a second position B along the guiding element 134 relative to the chassis. The damper 136 is disposed in the rack 110. In this embodiment, a movement direction D1 of the actuator 132 along the guiding element 134 is substantially perpendicular to the movement direction D2 of the chassis 120 relative to the rack 110, such that the stopping structure 130 can stop the chassis 120 from moving in the rack 110.

In this embodiment, when the chassis 120 is moved out from the rack 110 and the actuator 132 is at the first position A, the damper 136 is interfered with the actuator 132 and stops the chassis 120 from being moved out from the rack 110. As the damper 136 is made of rubber, the damper 136 can withstand an impulsive force P applied by the actuator 132 on the damper 136 during the interference, and stop the chassis 120 from being moved out from the rack 110. In contrast, when the chassis 120 is moved out from the rack 110 and the actuator 132 is at the second position B, the damper 136 is not interfered with the actuator 132, so the chassis 120 can be moved out from the rack 110. Here, types or materials of the damper 136 are not limited, and any damper that can be interfered with and stop the actuator 132 and is capable of absorbing the impulsive force P may be used as the damper of the present invention.

As described above, the stopping structure 130 in the server 100 is provided with the damper 136, so that when a user pulls the chassis 120 out from the rack 110, the damper 136 can absorb the impulsive force P impacted on the stopping structure 130 at the instant when the chassis 120 is pulled out. This enables the stopping structure 130 to have both a stopping function and an anti-shock function. Therefore, when pulling out the chassis 120, the user does not need to worry about any damage to electronic elements (not shown) in the chassis 120 due to instant impacts caused by shock generated by an excessively large force.

This embodiment is further described below. Referring to FIGS. 2, 3, and 4, in this embodiment, the guiding element 134 includes two guiding holes 134a and 134b, and the actuator 132 includes a driving portion 141, a body 143, a stopping portion 145, and two guiding posts 144 and 146. The body 143 is disposed on the chassis 120, the guiding posts 144 and 146 are secured at the body 143 and are respectively corresponding to the guiding holes 134a and 134b, and the guiding posts 144 and 146 are movably inserted into the guiding holes 134a and 134b. This enables the actuator 132 to move in parallel with the guiding element 134 through the combination of the guiding posts 144 and 146 and the guiding holes 134a and 134b when the actuator 132 is moving, so as to prevent the actuator 132 from having different displacements at the guiding posts 144 and 146.

On the other hand, in another embodiment (not shown) of the present invention, the actuator includes two guiding holes, and the guiding element includes two corresponding guiding posts, which can also achieve the above effect of enabling the actuator to move parallelly along the guiding element. Here, the movement structure between the actuator and the guiding element is not limited in the present invention. In another embodiment (not shown) of the present invention, the guiding element may also include slide rails, and the actuator may move parallelly along the slide rails, which can also achieve the purpose of the present invention. Therefore, any structure that can enable the actuator to move parallelly along the guiding element is applicable to the present invention.

Moreover, the guiding posts 144 and 146 respectively have a steplike portion 144a and a steplike portion 146a, and the guiding element 134 further includes at least one elastic element 150. In this embodiment, the elastic element 150 is sleeved on one of the guiding posts 144 and 146, used to enable the actuator 132 to have a restoring function, and can also enable the actuator 132 to automatically move from the second position B back to the first position A; however, the present invention is not limited thereto. Here, the elastic element 150 sleeved on the guiding post 144 is taken as an example for illustration. One end of the elastic element 150 is closely pressed against the steplike portion 144a, and the other end of the elastic element 150 is closely pressed against the guiding element 134. When the actuator 132 is at the second position B, the steplike portion 144a compresses the elastic element 150.

When the user intends to pull out or push in the chassis 120, the actuator 132 is at the first position A; and after the actuator 132 is interfered with the damper 136, the user can apply a force to drive the actuator 132 to move to the second position B. At this time, the actuator 132 compresses the elastic element 150 through the steplike portion 144a. After the user pulls out or pushes in the chassis 120, the restoring force of the elastic element 150 drives the actuator 132 back to the first position A.

Moreover, the stopping portion 145 is located on one side of the body 143 and extends from the body 143 and away from the chassis 120. In other words, the stopping portion 145 extends from an inner side of the chassis 120 and protrudes out to an outer side of the chassis 120, such that when the actuator 130 is at the first position A, the stopping portion 145 can be interfered with the damper 136. On the other hand, the driving portion 141 is located on the other side of the body 143 distant from the stopping portion 145, such that the user can apply a force to push the actuator 130, so as to move the stopping portion 145 away from the position where the stopping portion 145 is interfered with the damper 136. In other words, the user can control the actuator 132 to move the stopping portion 145, so as to enable the stopping portion 145 to be or not to be interfered with the damper 136.

To sum up, the damper and the actuator are provided in the stopping structure and the server having the same of the present invention, so that when pulling the chassis out from the rack, the user may firstly stop the chassis by utilizing the stopping relation between the damper and the actuator, subsequently apply a force to drive the actuator to move away from the position where the actuator is interfered with the damper, and then move the chassis out from the rack. This enables the damper to withstand and absorb the impulsive force caused by pulling the chassis out from the rack and thus prevents the chassis and the electronic elements therein from undergoing any shock, and then allows the user to pull the chassis out from the rack. Therefore, the chassis and the electronic elements therein can be effectively protected, thus prolonging the lifetime of the server.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A stopping structure, applicable to a server, wherein the server comprises a rack and at least one chassis, the chassis disposed in the rack moves relative to the rack, and the stopping structure is disposed between the rack and the chassis, the stopping structure comprising:
   an actuator, disposed on the chassis;
   a guiding element, disposed on the chassis, wherein the actuator moves parallelly between a first position and a second position along the guiding element relative to the chassis; and
   a damper, disposed in the rack, wherein when the chassis is moved out from the rack and the actuator is at the first position, the damper is interfered with the actuator, and when the chassis is moved out from the rack and the actuator is at the second position, the damper is not interfered with the actuator, wherein the actuator comprises:
   a body, disposed on the chassis, wherein the body moves relative to the chassis through the guiding element, and a moving direction of the body is perpendicular to that of the chassis in the rack; and
   a stopping portion, located on one side of the body and extending from the body and away from the chassis, wherein when the actuator is at the first position, the damper is located on a movement path of the stopping portion, and when the actuator is at the second position, the damper is not located on the movement path of the stopping portion.

2. The stopping structure according to claim 1, wherein the guiding element comprises two guiding holes, the actuator comprises two guiding posts that are respectively corresponding to the guiding holes, and the guiding posts are movably inserted into the guiding holes.

3. The stopping structure according to claim 2, further comprising at least one elastic element, wherein each guiding post is provided with a steplike portion, the elastic element is sleeved on one of the guiding posts, one end of the elastic element is closely pressed against the steplike portion, and the other end of the elastic element is closely pressed against the guiding element, and when the actuator is at the second position, the actuator drives the steplike portion of the guiding post to compress the elastic element.

4. The stopping structure according to claim 1, wherein the actuator further comprises a driving portion on the other side of the body distant from the stopping portion.

5. A server, comprising:
   a rack; and
   at least one chassis, disposed in the rack and moving relative to the rack; and
   a stopping structure, disposed between the rack and the chassis, wherein the stopping structure comprises:
   an actuator, disposed on the chassis;
   a guiding element, disposed on the chassis, wherein the actuator moves parallelly between a first position and a second position along the guiding element relative to the chassis; and
   a damper, disposed in the rack, wherein when the chassis is moved out from the rack and the actuator is at the first position, the damper is interfered with the actuator, and when the chassis is moved out from the rack and the actuator is at the second position, the damper is not interfered with the actuator, wherein the actuator comprises:
   a body, disposed on the chassis, wherein the body moves relative to the chassis through the guiding element, and a moving direction of the body is perpendicular to that of the chassis in the rack; and
   a stopping portion, located on one side of the body and extending from the body and away from the chassis, wherein when the actuator is at the first position, the damper is located on a movement path of the stopping portion, and when the actuator is at the second position, the damper is not located on the movement path of the stopping portion.

6. The server according to claim 5, wherein the guiding element comprises two guiding holes, the actuator comprises two guiding posts that are respectively corresponding to the guiding holes, and the guiding posts are movably inserted into the guiding holes.

7. The server according to claim 6, further comprising at least one elastic element, wherein each guiding post is provided with a steplike portion, and the elastic element is sleeved on one of the guiding posts, one end of the elastic element is closely pressed against the steplike portion, and the other end of the elastic element is closely pressed against the guiding element, and when the actuator is at the second position, the actuator drives the steplike portion of the guiding post to compress the elastic element.

8. The server according to claim 5, wherein the actuator further comprises a driving portion on the other side of the body distant from the stopping portion.

* * * * *